United States Patent [19]

Popodi

[11] 4,083,015
[45] Apr. 4, 1978

[54] FAST SWITCHING PHASE LOCK LOOP SYSTEM

[75] Inventor: Alfred E. Popodi, Glen Burnie, Md.

[73] Assignee: Westinghouse Electric Corporation, Pittsburgh, Pa.

[21] Appl. No.: 817,931

[22] Filed: Jul. 22, 1977

Related U.S. Application Data

[63] Continuation of Ser. No. 678,802, Apr. 21, 1976, abandoned.

[51] Int. Cl.² .............................................. H03B 3/04
[52] U.S. Cl. ........................................... 331/4; 331/12
[58] Field of Search .................... 331/4, 10, 11, 12, 14, 331/17

[56] References Cited

U.S. PATENT DOCUMENTS

| 3,421,105 | 1/1969 | Taylor | 331/17 |
| 3,795,870 | 3/1974 | Sanders | 331/17 |
| 3,825,855 | 7/1974 | Basset et al. | 331/14 |
| 3,909,735 | 9/1975 | Anderson et al. | 331/17 |

Primary Examiner—John Kominski
Attorney, Agent, or Firm—H. W. Patterson

[57] ABSTRACT

A phase lock loop system that includes a voltage controlled oscillator. The output of an integrator provides the voltage to a tuning port for determining the precise frequency and phase of the oscillator. In response to a change in frequency, the input to the integrator is switched off at the precise time that its output voltage reaches the value for the proper phase relationship at the new frequency. The output of a low pass filter fed by the loop's phase detector determines such precise time. At said precise time, the stabilized condition of the loop is sensed and corrected for minor deviations.

6 Claims, 6 Drawing Figures

FAST SWITCHING PHASE LOCK LOOP SYSTEM

This is a continuation of application Ser. No. 678,802 filed Apr. 21, 1976, and now abandoned.

BACKGROUND OF THE INVENTION

1. Field of the Invention

The present invention relates to an improved phase lock loop system, and more particularly to a phase lock loop system for fast frequency switching radar or electronic counter measure systems.

2. Prior Art Discussion

In radar systems suitable for moving target indication, it is necessary that the generated pulses are precisely in a fixed phase relationship to a master oscillator in order that the phase shift of the received or echo pulses can be accurately detected for discriminating between moving and stationary targets.

In the past, such radar systems generated phase coherent pulses of a single selected frequency. However, such single frequency transmission could readily be rendered ineffective if other radar systems in the same area were generating pulses of the same frequency; such as would be the case, where there was intentional jamming, for example. Therefore, radar systems were built that had the ability to change frequencies automatically in the event that interference occurred on the frequency being used.

In a radar system with a 200 mile range, for example, the pulse repetition frequency is 330 Hz. Thus, the pulse echo for each respective pulse reaches the receiver in 2.46 milliseconds. It is the time between the reception of the pulse echo and the next pulse transmission that is left for changing frequencies. In the example given, this time for changing frequencies, which is termed "dead time" is in the order of 0.54 milliseconds. However, this dead time can be much shorter or longer, depending on range and pulse repetition frequency.

In advanced radar systems it is desirable to be able to change the receiving frequency rapidly and to be able to select as many frequencies as possible during the available dead time in order to perform a jamming analysis. Thus, it is necessary that such change must be effected rapidly in the order of 30 microseconds, for example.

In such radar systems, it is preferable to use what is commonly termed a "phase lock loop" for maintaining the generated frequency pulses in an exact phase relationship with a master oscillator, regardless of variations caused by temperature differentials or other drifts in the components. A typical prior art phase lock loop is shown schematically in FIG. 1, and includes a voltage controlled oscillator (VCO) 10 having a coarse tuning port 11 and a fine tuning port 12. The output of the VCO 10 is a frequency that depends on the value of the input voltages applied to the coarse and fine tuning ports 11 and 12. The coarse tuning voltage is supplied by an integrator 13. The input voltage to the VCO 10 from the integrator 13 remains constant when its input 14 has 0 volts. A reference frequency on 15 is compared with the output frequency on line 16 of the VCO 10 by a phase detector 17. At times when the output frequency of the VCO 10 changes its phase with respect to the reference voltage, a DC error voltage appears on line 18 at the input to an amplifier 19, the output of which is connected to a second amplifier 20, and the input 14 of the integrator 13. The amplified error voltage, which is applied to the coarse and fine tuning ports 11 and 12 varies the input voltage to the VCO 10 to correct the phase of the frequency from the VCO 10 to reduce the error voltage. Thus, the loop is self-correcting to maintain the proper phase relationship with the reference voltage. When the reference voltage frequency on line 15 is the same as the output frequency on line 16 with the loop operating in a manner to maintain the proper phase, the loop is in a "locked" condition. Thus, in locked condition, the fine tuning voltage is nearly zero and the coarse tuning voltage has a fixed value.

To change the frequency, the reference frequency on the line 15 is changed to the desired frequency and a switch 21 is closed momentarily to apply a "sweep" control voltage to the input of the integrator 13 for changing the input voltage to the VCO 10 such that loop can self-lock at the new frequency.

When the frequencies of the reference voltage and the VCO voltage differ, the loop is said to be "unlocked". In the unlocked condition, an alternating voltage appears at the output of the phase detector. If, by external means, the VCO tuning voltage is made to vary towards the new voltage, representing the new frequency, the phase lock loop will go to the locked condition. The two frequencies are equal, but their initial phase difference is still undergoing a change until, at the end of the so-called phase settling time, their phase relationship does not change any more. Thus, the loop goes through a settling period while the loop self-corrects to reduce the amplifier 20 phase error voltage to zero for the proper and final phase relationship. This phase settling time can be much longer than the time required for the frequency change alone. Therefore, in summary, for every change of frequency, the loop goes through two steps. The first step is a change of frequency, until the loop is "locked", but the phase has not yet stabilized. The time required for this step is referred to as the "capture" time. The second step is the time required for the phase of the loop to become stabilized. This step is referred to as the phase "settling" time.

It is well known that the greater the amplitude of the input voltage to the loop integrator 13, the faster that it will react to provide the desired change in voltage to the VCO 10. However, if the voltage is too great, the loop will go right through the proper value and will not "lock". If the amplitude is relatively low, the time required for the integrator to change its output voltage is too slow. Therefore, in order to insure that the loop "locks" in response to a change in frequency in the least amount of time, a "sweep" control voltage is provided upon the closure of the switch 21 (FIG. 1) which "prepositions" the new voltage just short of the new required voltage as shown in FIG. 2. Assuming that the system is operating at frequency F1 and a change is to be made to frequency F2, the input voltage to the integrator 13 is changed to a voltage corresponding to the lower band limit rapidly; and is then rapidly reversed until it reaches a voltage represented as P, which is slightly less than the voltage required for the frequency F2, at which time the switch 21 opens. Due to the high rate of change of the tuning voltage, the loop cannot lock. Therefore, from point P on, the sweep rate must be reduced to allow the loop to lock at point Q. The maximum allowable sweep rate for self-locking depends on loop gain and loop bandwidth. At the capture point Q, the first portion of the transfer is complete and the "settling" time period begins, which is much longer than the capture time. The reason for this is the inherently slow integrator response. With reference to FIG.

3, it is seen that the loop can "lock" at any point within the "capture" range where an error voltage as represented by line 24 exists. At any point along line 24, with the exception of the precise point $T_O$, the loop is locked, but not yet phase stabilized.

Assuming that the switch 21 (FIG. 1) opens at point P, for example, a slow sweep is initiated through switch 21' from P to Q of FIG. 2 until it self-locks, such as at point Q, for example, in the capture range. Thus, in such case, the settling time extends from time $T_1$ to $T_0$, which may be in the order of one to ten milliseconds. The time $T_0$ on line 24 corresponds to the precise voltage required for the proper phase relationship of the new frequency.

It follows that the "settling" time for the typical loop after a change in frequency can be anywhere along line 24 between X and Y. Thus, the closer that the point Q is to the time $T_0$, the faster a transfer can occur from one frequency to another with a much shorter phase "settling" time.

U.S. Pat. No. 3,795,870 proposes a phase lock loop wherein means are proposed to increase the speed of locking of the loop by operating a frequency/phase detector circuit in the frequency detector mode when the loop is "unlocked" to control a speed-up circuit to slow the oscillator to the "lock" condition. While the speed-up circuit brings the loop to the locked condition, the bandwidth of the loop is at a high value to provide a fast loop response. When the loop is able to lock, the bandwidth is lowered to the optimum value for good noise performance. Although this patent directs itself to speeding up the locking, the system can still lock itself anywhere within the "capture range".

Therefore, it is desirable to provide a phase lock loop system that is controllably locked to thereby substantially reduce the phase settling time when transferring from one frequency to another.

SUMMARY OF THE INVENTION

The present invention provides an improved phase lock loop that controllably and positively locks the loop in response to a change in frequency at a precise and predictable time such that the phase error between the reference and VCO is minimal.

DESCRIPTION OF THE PREFERRED EMBODIMENT

Figure 4:
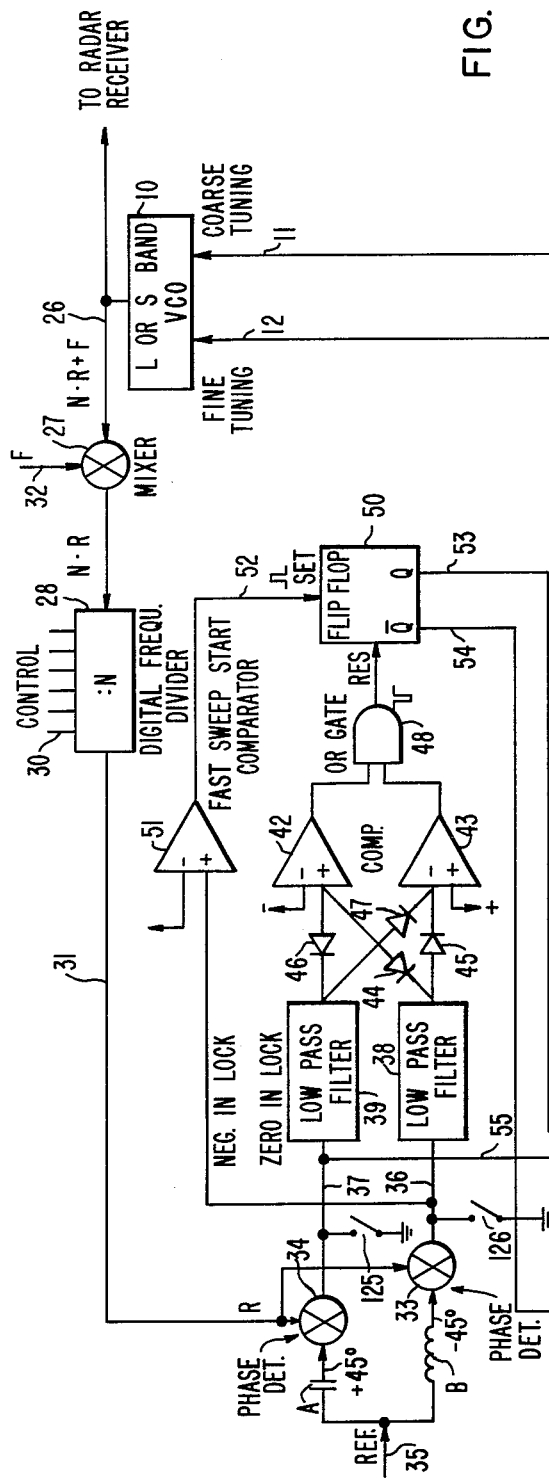
FIG. 4 is a schematic diagram of a phase lock loop system according to one embodiment of the present invention.
Figure 4:
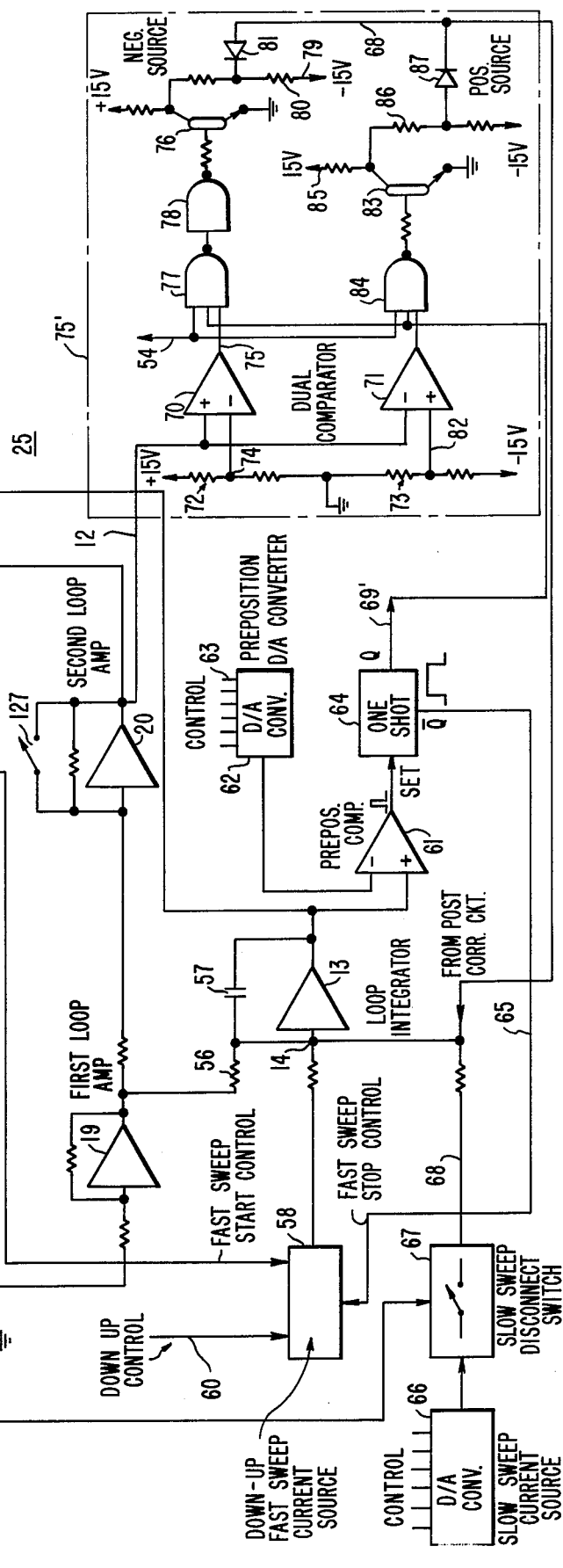

Referring to FIG. 4, a phase lock loop system 25 includes the voltage controlled oscillator 10 having a coarse and fine tuning port 11 and 12. The oscillator 10 for radar applications may be of the type suitable for L or S band frequencies. An output 26 of the oscillator is connected to a radar receiver (not shown) and to an input of a conventional frequency mixer 27 to change the frequency from an L or S band to a practical lower IF frequency, for example, for input to a digital frequency divider 28. The divider 28 is controlled via digital inputs 30 to generate the desired frequency on output 31. An input 32 to the mixer functions to lower the output frequency to the divider 28 as previously described. The digital frequency divider, such as 28, is capable of changing frequencies on output 31 during a period of less than 100 nanoseconds. Such digital frequency dividers are common and well known in the art.

The output 31 of the divider 28 is input to a pair of phase detectors 33 and 34. The phase detectors compare the phase of the frequency on line 31 with the phase of a reference frequency on line 35 that corresponds to the precise phase relationship of a master oscillator (not shown). At the termination of the settling period, the phase of the reference voltage on 35 and the phase of the frequency on 26 are in the proper relationship.

Because of the plus and minus 45° phase shifts introduced by conventional phase shifting elements A and B that are inserted between the reference input 35 and the phase detectors 33 and 34, the phase detector 34 output is nearly zero when the loop is locked and the output of phase detector 33 is most negative when the loop is locked. Thus, because such detectors are 90° out of phase with respect to each other, one or the other of the detectors will supply a DC voltage pulse on its respective output 36 or 37 prior to the other.

A low pass filter 38 has its input connected to the output 36 of the detector 33; and a low pass filter 39 has its input connected to the output 37 of the phase detector 34. The filters 38 and 39 function to provide an output voltage in response to a particular frequency output from the detectors 33 and 34 as discussed in connection with FIG. 5. Line 40 represents the decrease in the frequency of the AC signal at the output of the detectors 33, 34 during the sweep of the voltage on the tuning port 11 of the oscillator 10 during a change in frequency as discussed in connection with FIG. 2. Line 41 represents the output of the filter 38, 39 as the input frequency from its associated respective detector 33, 34 decreases. Thus, the input to the filter is an FM signal whose frequency varies nearly linearly from an initial value (out of lock condition) towards zero, which is the ideal locking point as discussed in connection with FIG. 3. The output voltage of the filter 38, 39 exceeds a given threshold value exactly at time $T_O$ (see FIG. 3) if the proper rate of frequency change is selected. For example, and referring to FIG. 5, utilizing a 50 kHz low pass filter with an FM input signal of 115 kHz which decreases linearly to zero in 30 microseconds provides a threshold level of 0.7 times greater than the input voltage at the time $T_O$, which is the ideal locking point. In order to predict the threshold locking point, the rate of change of the frequency should be matched to the filter response. In the above example, a 50 kHz filter together with a 115 kHz rate of change in 30 microseconds provide an output signal at the ideal locking point $T_0$ for a given threshold value. However, for other applications, the parameters of the system can be selected to produce the desired filter output by varying the slope of the FM ramp (FIG. 5), which slope is controlled by a slow sweep current source hereinafter described. The ideal locking point is evidenced by matching the time of occurrence of the threshold output voltage from the filter 38, 39 to correspond to a zero output from the amplifier 20, at which time the loop is completely stabilized. The time $T_0$ is independent of the initial starting frequency if the rate of the frequency change is constant. However, the timing of the threshold value of the filter 38, 39 output is to some degree dependent on the initial phase of the input frequency on lines 36, 37. If the initial phase is varying on a random basis, small variations in timing output do occur. This timing variation, for the example given, may be up to several microseconds. For this reason, for applications where such timing variation is undesirable, two detectors 33, 34 are utilized having an input phase that is in quadrature to the other as previously described. Thus, such variation can be reduced to a minimum as described hereinafter.

The outputs of the filters 38, 39 are connected to control voltage comparators 42 and 43. The filter 38 is connected through diodes 44 and 45 while the filter 39 is connected through diodes 46 and 47 to the comparators 42 and 43. The voltage comparators 42 and 43, are conventional digital devices that generate an output signal when their input signals exceed a preselected threshold voltage.

Thus, since the detectors 33 and 34 operate in quadrature, one or the other of the comparators 42 or 43 responds first and resets flip-flop 50 through OR gate 48. This minimizes any time variation in the threshold output of the filters due to variations in the starting phase.

Figure 1:
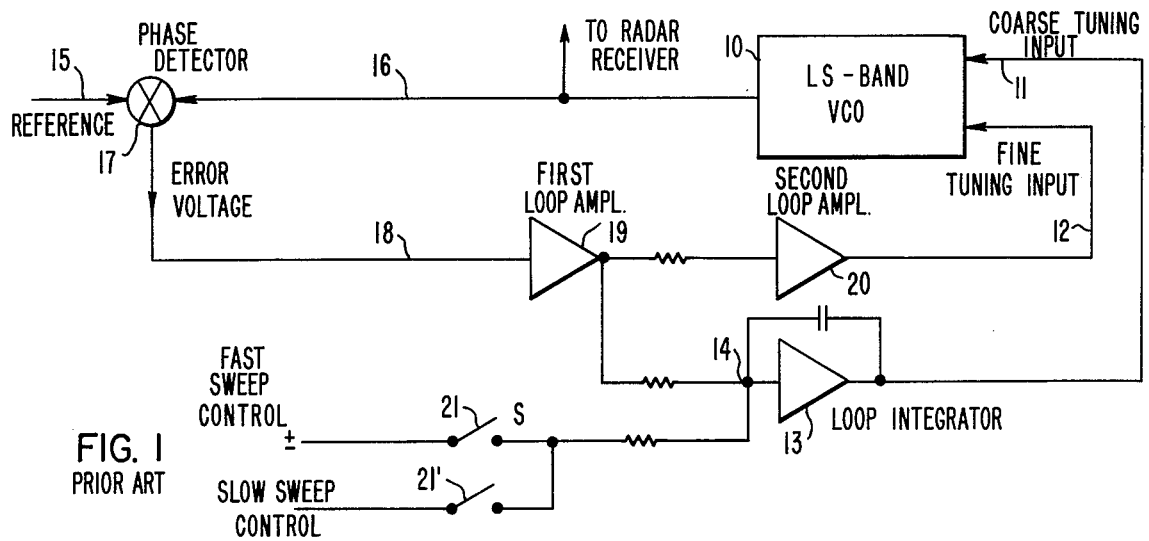
FIG. 1 is a schematic diagram of a typical prior art phase lock loop.
Figure 2:
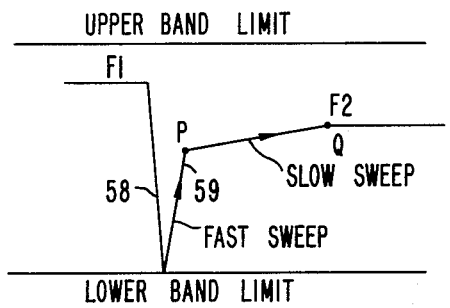
FIG. 2 is a diagram to illustrate the sweep control voltage during a change of frequencies.
Figure 5:
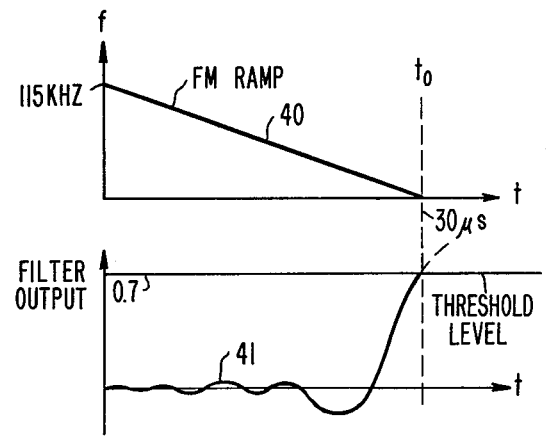
FIG. 5 is a diagram illustrating a frequency modulated ramp at the output of a phase detector and the corresponding output of its filter during a change of frequency of the system of FIG. 4.
Figure 3:
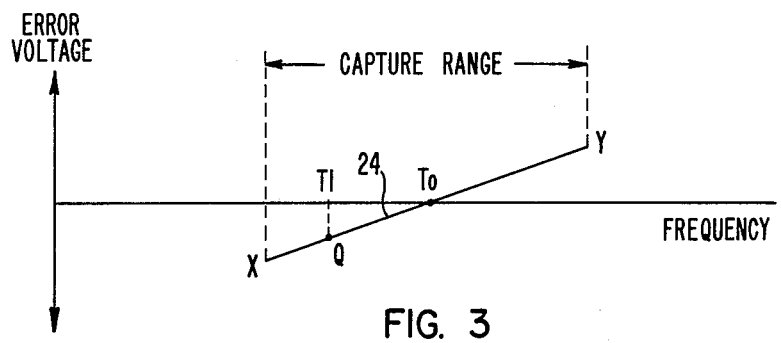
FIG. 3 is a diagram to illustrate the "capture" range for locking the loop and the ideal phase relationship.

A conventional voltage comparator 51 has its noninverting input connected to the output 36 of the detector 33 and its inverting input to a reference voltage. In response to change from negative DC to zero DC which occurs when the loop goes out of lock, which occurs when a frequency change is initiated, causes the device to generate a positive output on line 52 to set the flip-flop circuit 50. Thus, the flip-flop circuit is set to produce a characteristic output on line 53 at the beginning of a change in frequency; and is reset to provide an output on line 54 at the precise time that the low pass filter 38, 39 detects the correct phase condition which corresponds to time $T_0$ (FIG. 3 and FIG. 5). The phase detector 34 supplies the error signal to the phase lock loop system over line 55 to the amplifiers 19 and 20 that are connected to the fine tuning port 12 of the oscillator 10. The loop amplifier 19 is connected through a resistor 56 to the input 14 of the integrator 13 and through a capacitor 57 to the output of the integrator 13. The block referred to at 58 is a conventional current source to provide that portion of the voltage sweep to the integrator 13 represented by line portions 58 and 59 of FIG. 2. The device 58 may be any conventional sweep current source that functions to provide an output as mentioned in connection with FIG. 2. The device 58 commences its output to the input 14 of the integrator 13 in response to the setting of the flip-flop 50 when the loop is initially unlocked. The down-up control on line 60 functions to reverse the sweep direction when the lower boundary of the tuning range is reached (FIG. 2). The output of the integrator 13 is connected to a voltage comparator 61 which compares the voltage appearing on the coarse tuning port 11 with a voltage at the output of a digital to analog converter 62. The converter 62 is controlled by digital inputs 63 in a conventional manner to provide an output voltage at the prepositioning value P as shown on FIG. 2, which is just below the proper voltage required for operating the oscillator 10 at the required frequency to which it is being changed. In response to the integrator output attaining this pre-positioning voltage, a one-shot multivibrator 64 produces an output on line 65 to stop the fast sweep control of the device 58. A slow sweep current source 66 which may be a conventional digital to analog converter provides a current output to switch 67 in accordance with the digital input controls referred to at 68 in a conventional manner.

As shown in FIG. 4, the slow sweep current source 66 is not a constant current source, but is preferably, a digitally controlled variable current source. The degree of variation depends on the voltage versus frequency relationship of the VCO 10 at the frequencies of interest.

The switch 67, which may be an electronic switch such as an FET, for example, is closed in response to a distinctive output on the line 54 of the flip-flop 50 to apply the slow sweep current to the input of the integrator 13. Upon the resetting of the flip-flop 50, the slow sweep current source 66 is interrupted to terminate the input current flow to the integrator 13 at the precise time $T_0$ (FIG. 3), which corresponds to the ideal locking point; or in other words, when the fine tuning port 12 is zero. This exact time will be described relative to the operation of the system as a whole in connection with FIG. 6.

In order to further reduce the effect of any small timing errors of the output of the low pass filters 38 and 39, due to random phase variation and other error sources, a correction circuit is provided that includes a voltage comparator 70 and 71. The comparator 70 has its non-inverting input and the comparator 71 has its inverting input connected to the fine tuning port 12 at the output of the second loop amplifier 20. The inverting input of the comparator 70 and the non-inverting input of the comparator 71 are connected to a resistor network 72 and 73, respectively to provide a reference voltage which is in the neighborhood of +10 millivolts for the comparator 70 and −10 millivolts for the comparator 71, for example. The comparators 70 and 71, as connected, may be termed a voltage window detector to be maintained within certain limit values. It is recalled, that the output of the second loop amplifier 20 that drives the fine tuning port 12 of the voltage controlled oscillator 10 must be exactly zero when the loop is in a fully settled condition. The zero output of the amplifier 20 corresponds to a zero phase error. Even though the precise time of the opening of the switch 67 is controlled to occur at the time $T_0$, the output of the amplifier 20 may deviate from zero after the opening of the switch 67. To insure against such an occurrence and compensate for tuning and component errors, the correction circuit is provided. If the amplitude of the error signal at the output 12 of the second loop amplifier 20 is more positive than the voltage at the junction point 74 (approximately 10 millivolts), output 75 of the comparator 70 becomes positive. This causes the transistor 76 to become saturated through NAND gates 77 and 78, which causes a negative current flow from a negative 15 volt supply 79 through a resistor 80, a diode 81, to the summing point 14 of the integrator 13. This drives the output 11 of the integrator 13 more positive until, due to the natural action of the phase lock loop, the output of the amplifier 20 drops below the threshold level of 10 millivolts, shutting off the transistor 76. Similarly, if the output 12 of the loop amplifier 20 is more negative than the voltage at the input 82 of the comparator 71, a transistor 83 is cut off through NAND gate 84 which causes a positive current flow from a positive voltage source 85 through a resistor 86 and a diode 87 to the point 14 of the loop integrator 13. This drives the integrator output 11 more negative until, due to natural loop action, the output of the amplifier 20 drops below the threshold level, saturating transistor 83. Since the source currents of the transistors 76 and 83 can be high, any corrections after the opening of the switch 67 can be accomplished in few microseconds. The NAND gates 77, 78 and 84 are provided for enabling the correction circuit temporarily from the resetting of the flip-flop 50 until the timing out of the one-shot multivibrator 64'.

Figure 6:
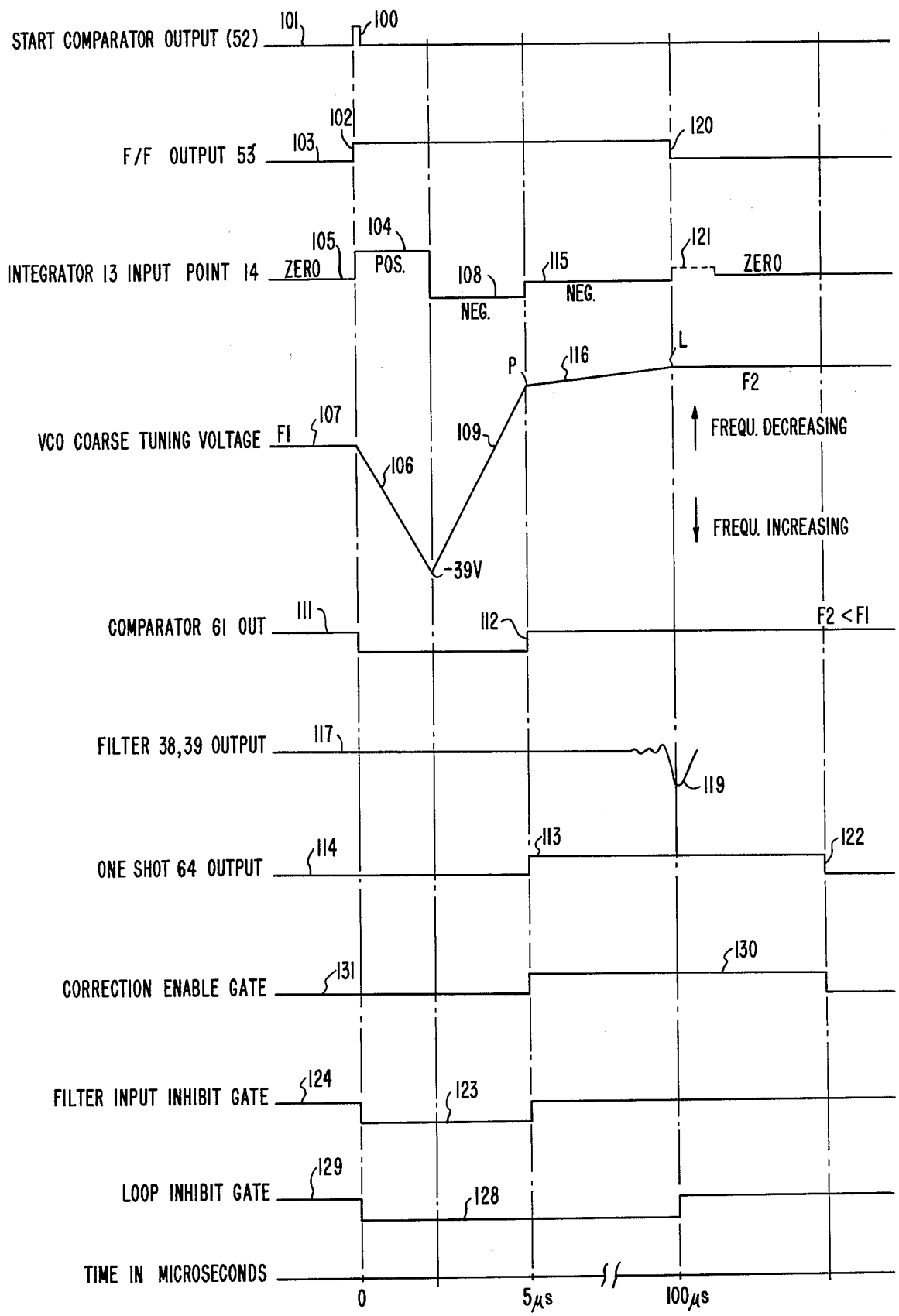
FIG. 6 is a timing graph showing the operation of the components of the system of FIG. 4 upon a transfer from one frequency to another.

For a better understanding of the system of the present invention, the operation of the system of FIG. 4 is described in connection with the waveforms of FIG. 6. Assuming that the phase lock loop system is in a locked and settled condition, the output 54 of the flip-flop circuit 50 is present for maintaining the switch 67 in an open condition. The output of the loop amplifier 20 connected to the fine tuning port 12 is zero and the correction circuit 75' is inhibited through the deactivation of the one-shot multivibrator 64. Also, the fast sweep current source 58 is disconnected from the summing point 14 of the integrator 13. In this condition, the phases of the frequency on line 31 and the reference frequency on line 35 are in the proper relationship and the loop is in a settled condition. Thus, the output 37 of the phase detector 34 is nearly zero. The output of the integrator 13 to the coarse tuning port 11 is a constant DC voltage that lies between $-15$ volts DC and $+15$ volts DC. A constant DC offset voltage of 24 volts is applied to the integrator 13 is a conventional manner so that the coarse tuning voltage of the oscillator 10 is therefore a DC voltage that lies between $-39$ and $-9$ volts, for example, depending on the frequency output of the oscillator 10.

In response to a change of frequency on the output 31 of the digital frequency divider 28, the loop unlocks. This is sensed by the comparator 51 are previously described and produces a pulse 100 of a waveform 101 on its output 52 which sets the flip-flop circuit 50 to produce an output on line 53 as shown by a step 102 of a waveform 103.

The setting of the flip-flop 50 activates the down-up fast sweep current source 58 and closes switch 67 to apply a positive going input pulse at the summing junction 14 of the integrator 13 as shown by portion 104 of a waveform 105. In response to the positive input to the junction 14, the coarse tuning voltage at the output of the integrator 13 is driven to its maximum negative potential of $-39$ volts, for example, as shown by portion 106 of a waveform 107. The down-up control on line 60, as well known in the art, causes the current source 58 to reverse direction to apply a negative pulse 108 of the waveform 105 of relatively large amplitude which forces the coarse tuning voltage in a positive direction as shown by portion 109 of the waveform 107.

When the pre-position comparator 61 senses equality between a predetermined voltage from the converter 62 and the integrator output voltage, it changes condition as shown by portion 112 of the waveform 111 which activates the one-shot multivibrator 64 as shown by portion 113 of a waveform 114. The output of the one-shot multivibrator 64 stops the fast sweep current source 58 over its output 65 in a conventional manner, whereby the only voltage input to the junction point 14 of the integrator 13 is now being applied through the closed switch 67 from the slow sweep digital to analog converter 66 over the input 68. This results in a less negative voltage being applied to the junction point 14 as shown by portion 115 of the waveform 105, which of couse, slows down the rate of rise at the input 11 to the oscillator 10 as shown by segment portion 116 of the waveform 107.

In response to the changing of the frequency as previously described, the output 36 and 37 of the phase detectors 33 and 34, respectively, generates an AC voltage that is modulated in frequency as the frequency on the output line 31 approaches the frequency of the reference source on line 35. While the AC voltage is present and the frequency is high, the low pass filters 38 and 39 are producing substantially no output as shown by waveform 117. At the precise time of the ideal phase relationship, the first filter 38 or 39 to sense such a condition produces a pulse represented by portion 119 of the waveform 117. This pulse resets the flip-flop 50 through the OR gate 48 to open the switch 67 by producing a characteristic output on line 54, which is represented by portion 120 of the waveform 103. The opening of the switch 67 disconnects the input junction 14 of the integrator 13 from the slow sweep current source 66 present at the output of the digital to analog converter at the precise time referred to as L of the waveform 107, at which time the phase error is at a minimum. Thus, the loop is prevented from self-locking too early and at a point prior to the ideal locking point as represented by $T_0$ of FIG. 3.

The correction circuit 75' was enabled at the precise time $T_0$ and is activated only for a limited time until the timing out of the one-shot multivibrator occurs as shown by the portion 122 of the waveform 114. The time that the correction circuit 75' is enabled is shown by portion 130 of waveform 131. This correction circuit senses both the amplitude and polarity of an error output, if any, from the second loop amplifier 20 to the fine tuning port 12 to apply either a positive or a negative correction to the input junction 14 following the opening of the switch 67, as previously described. This positive and negative correction is illustrated by portion 121 of the waveform 105. The disconnecting of the correction circuit 75' then places the loop under the sole control of the loop amplifiers 19 and 20, connected to the fine tuning port 12 and integrator 13 connected to the coarse tuning port for maintaining the output frequency of the oscillator 10 and the reference frequency on the line 35 in phase coherency. The input to the low pass filters 38 and 39 may be inhibited during the fast sweep portion of the transfer as represented by portion 123 of waveform 124 by switches 125 and 126, which can be controlled by conventional logic circuitry from the flip-flop 50 and the one-shot multivibrator 64.

The fine tuning loop is disabled by closing of switch 127 during the time that the fast and slow sweep of the integrators is occurring, as shown by portion 128 of the waveform 129. This may be controlled by the output of the flip-flop.

Thus, from the foregoing description of the structure and operation of the system of the present invention, it is seen that the sweep voltage is interrupted at the precise time $T_0$ (FIG. 3) in the center of the capture range; and that a correction circuit applies an input voltage to the integrator 13 in both directions to further more rapidly provide the proper output voltage from the integrator 13 to the coarse tuning port 11 in response to the sensing of any deviation or error voltage at the input to the fine tuning port 12 subsequent to the interruption. In an actual embodiment of the invention, utilizing the prior art pre-positioning techniques, the settling time was decreased from several milliseconds to 100 microseconds with a phase settling to within ±0.05 of a degree as measured at the VCO output.

It is understood, that various modifications may be made in the system of the present invention. For example, various modifications in the circuit could be made so that zero crossing detectors are utilized in place of the low pass filters 38, 39 if desired and a voltage controlled oscillator with a single tuning port could be utilized for example, as well as other modifications obvious to those skilled in the art, without departing from the spirit or scope of the present invention, except as limited by the appended claims.

I claim:

1. A phase lock loop system for decreasing the phase settling time for phase coherency with a reference frequency immediately after lock when switching from one desired frequency to another desired frequency, comprising:

a voltage controlled oscillator for generating at its output a frequency signal that varies as a function of its input voltage;

phase comparator means to generate at its output an alternating output signal that decreases in frequency to provide a frequency modulation ramp as the difference between the oscillator frequency and the reference frequency decreases;

a low pass filter means responsive to the frequency modulation of the phase comparator means output to generate at its output a single pulse of a predetermined theshold value, said filter having a response time matching a predetermined frequency modulation rate of the phase comparator means output such that the duration of one period of the filter cut-off frequency is substantially equal to the duration of the predetermined frequency modulation rate of the phase comparator means to generate said single pulse at a precise time substantially in the center of the capture range, tuning loop means when connected coupling electrically the output of the phase comparator means to the input of the oscillator, said tuning loop means also including means operative to generate a constant voltage output when the phase comparator means output is at zero error potential to lock the phase of the oscillator frequency to the phase of the reference frequency;

a normally inactive current sweep source operative when activated to change the input voltage to the oscillator at a predetermined rate to provide such predetermined frequency modulation rate at the output of the comparator means;

first circuit means responsive to a change to a desired frequency to activate the current sweep source and disconnect the tuning loop means from the oscillator input; and second circuit means responsive to said single pulse to deactivate the current sweep source and connect the tuning loop means to the oscillator substantially simultaneously.

2. A phase lock loop system for decreasing the phase settling time immediately after lock for phase coherency with a reference frequency when switching from one desired frequency to another desired frequency, comprising:

a voltage controlled oscillator having a coarse and a fine tuning port, said coarse and fine tuning ports varying the frequency and phase of the oscillator output signal as a function of the value of a first and second oscillator input signal respectively;

phase comparator means operatively connected to compare the frequency and phase of a reference frequency with the frequency and phase of the oscillator output signal, said means being operative to generate at its output an alternating output signal that decreases in frequency toward zero to provide an FM ramp as the difference between the oscillator frequency and reference frequency decreases;

first circuit means when connected to couple the output of the phase comparator means to the fine tuning port to generate the second oscillator signal when the reference and oscillator frequencies are out of a desired phase relationship, second circuit means including an integrator connected to the coarse tuning port to vary the value of the oscillator input signal as a function of the duration and amplitude of a signal applied to the integrator input, a low pass filter means responsive to the frequency modulation of the phase comparator means output to generate at its output a single pulse of a predetermined threshold value, said filter having a response time matching a predetermined frequency modulation rate of the phase comparator means output such that the duration of one period of the filter cut-off frequency is substantially equal to the duration of the frequency modulation ramp of the phase comparator means to generate said single pulse at a precise time substantially in the center of the capture range, a sweep current source operative when activated to change the value of the integrator output signal at a predetermined rate to provide said predetermined frequency modulation rate to cause the duration of the frequency modulation ramp at the output of the phase comparator means to generate said single pulse when the first circuit means is at substantially zero error potential;

third circuit means for activating the sweep current source and disconnecting electrically the first circuit means from the fine tuning port in response to a detected change between reference and oscillator frequencies by the comparison means, and fourth circuit means responsive to the threshold value of the single pulse of the filter means to deactivate the sweep current source and connect the first circuit means to the fine tuning port substantially simultaneously.

3. A system according to claim 1 wherein the phase comparator means includes a pair of phase detectors that are connected in quadrature, and said filter means includes a low pass filter for the output of each of said phase comparator means.

4. A system according to claim 1 wherein the tuning loop means includes an integrator, and further comprising:

third circuit means responsive to a deviation of a selected input voltage to the oscilltor upon the connection of the tuning loop means by said second circuit means to apply any error signal occurring in the tuning loop means to the input of the integrator for a limited time interval.

5. A system according to claim 1 wherein the current sweep source includes a current generating source operative to generate a signal of a selected amplitude of opposite polarities successively for a first period of time, and means to generate an input signal of a predetermined lower amplitude upon the expiration of said first time period while the tuning loop means is disconnected by the first circuit means.

6. A system according to claim 2 wherein the sweep current source includes a first current generating source operative to generate a signal of opposite polarities successively for a first period of time insufficient to lock the phase lock loop, and a second current generating source operative to generate an input signal of a predetermined amplitude upon the expiration of said first time period while the first circuit means is disconnected.

* * * * *